(12) United States Patent
Carlson et al.

(10) Patent No.: US 7,687,304 B2
(45) Date of Patent: Mar. 30, 2010

(54) CURRENT-DRIVEN DEVICE USING NIMN ALLOY AND METHOD OF MANUFACTURE

(75) Inventors: Gregory A. Carlson, Santa Barbara, CA (US); Alok Paranjpye, Santa Barbara, CA (US); Jeffery F. Summers, Santa Barbara, CA (US); Douglas L. Thompson, Santa Barbara, CA (US)

(73) Assignee: Innovative Micro Technology, Goleta, CA (US)

( * ) Notice: Subject to any disclaimer, the term of this patent is extended or adjusted under 35 U.S.C. 154(b) by 530 days.

(21) Appl. No.: 11/605,312

(22) Filed: Nov. 29, 2006

(65) Prior Publication Data

US 2008/0124565 A1 May 29, 2008

(51) Int. Cl.
*H01L 21/00* (2006.01)
(52) U.S. Cl. .................. 438/69; 438/48; 438/57; 257/431; 257/432; 257/443; 257/E31.003; 257/E31.004; 257/E31.103
(58) Field of Classification Search ............ 250/277.11; 438/48
See application file for complete search history.

(56) References Cited

U.S. PATENT DOCUMENTS

| | | | | |
|---|---|---|---|---|
| 5,225,771 | A * | 7/1993 | Leedy | 324/757 |
| 5,840,110 | A | 11/1998 | Azuma et al. | |
| 6,859,304 | B2 * | 2/2005 | Miller et al. | 359/322 |
| 6,897,469 | B2 | 5/2005 | Syllaios et al. | |
| 7,190,179 | B2 * | 3/2007 | Haga et al. | 324/754 |
| 2002/0105396 | A1 | 8/2002 | Streeter et al. | |
| 2002/0180473 | A1 * | 12/2002 | Di Stefano | 324/762 |
| 2003/0222337 | A1 | 12/2003 | Stewart | |
| 2003/0228096 | A1 * | 12/2003 | Parker et al. | 385/27 |
| 2004/0031691 | A1 | 2/2004 | Kelly et al. | |
| 2005/0034668 | A1 | 2/2005 | Garvey et al. | |
| 2005/0140286 | A1 | 6/2005 | Ito et al. | |
| 2005/0201651 | A1 | 9/2005 | Elwood | |
| 2005/0250274 | A1 | 11/2005 | Forbes et al. | |
| 2007/0018077 | A1 * | 1/2007 | Puscasu et al. | 250/210 |
| 2007/0222004 | A1 | 9/2007 | Carlson et al. | |

FOREIGN PATENT DOCUMENTS

JP 10-148645 * 6/1998

OTHER PUBLICATIONS

Yang, et al."Metallurgy of high strength Ni-Mn microsystems fabricated by electrodeposition", Nov. 26, 2003, Scripta Materialia, 51, pp. 761-766.*

(Continued)

*Primary Examiner*—Ha Tran T Nguyen
*Assistant Examiner*—Karen M Kusumakar
(74) *Attorney, Agent, or Firm*—Jaquelin K. Spong (57) ABSTRACT

A material for forming a conductive structure for a micromechanical current-driven device is described, which is an alloy containing about 0.025% manganese and the remainder nickel. Data shows that the alloy possesses advantageous mechanical and electrical properties. In particular, the sheet resistance of the alloy is actually lower and more stable than the sheet resistance of the pure metal. Accordingly, when used for conductive leads in a photonic device, the leads using the NiMn alloy may provide current to heat the photonic device while generating less heat within the leads themselves, and a more stable output.

20 Claims, 8 Drawing Sheets

OTHER PUBLICATIONS

"The electrical resistivity of nickel and its alloys," T. Farrell et al., J. Phys. C (Proc. Phys. Soc.), 1968, ser. 2, vol. 1, pp. 1359-1369.

"Electrical resistivity and absolute thermoelectric power of liquid indium-nickel-manganese ternary alloys", J. Auchet et al., J. Phys.: Condens. Matter 11 (1999), pp. 3043-3050.

"Electroforming with Heat-Resistant, Sulfur-Hardened, Nickel," W.R. Wearmouth, et al., Journal of American Electroplaters' Society, (1979), vol. 66, No. 10, pp. 53-57.

"Electrical Resistivity Handbook," G.T. Dyos et al., (1992), Peter Peregrinus Ltd., London, United Kingdom, pp. 26-27, 440-441, and 728.

* cited by examiner

Pure nickel film

NiMn alloy film

CURRENT-DRIVEN DEVICE USING NIMN ALLOY AND METHOD OF MANUFACTURE

CROSS REFERENCE TO RELATED APPLICATIONS

This application is related to U.S. patent application Ser. No. 11/386,733, incorporated by reference in its entirety.

STATEMENT REGARDING FEDERALLY SPONSORED RESEARCH

Not applicable.

STATEMENT REGARDING MICROFICHE APPENDIX

Not applicable.

BACKGROUND

This invention relates to micromechanical current- or thermally-driven devices and their method of manufacture. In particular, this invention relates to infrared emitters and photonic crystals.

Microelectromechanical systems (MEMS) are very small, often moveable structures made on a substrate using surface or bulk lithographic processing techniques, such as those used to manufacture semiconductor devices. MEMS devices may be moveable actuators, sensors, valves, pistons, or switches, for example, with characteristic dimensions of a few microns to hundreds of microns. A moveable MEMS switch, for example, may be used to connect one or more input terminals to one or more output terminals, all microfabricated on a substrate. The actuation means for the moveable switch may be thermal, piezoelectric, electrostatic, or magnetic, for example.

MEMS may also be non-moving devices, such as photonic devices, fabricated using surface or bulk lithographic processing techniques. In such cases, small features required for the device to emit radiation in a narrow spectrum, for example, may be formed using MEMS techniques. Such a photonic device is a photonic crystal, formed from two metal films separated by a dielectric, with small holes formed in the metal films which determine the radiation output pattern and spectrum of the device. The device may be heated to an operating temperature of about 350 degrees centigrade, by driving a current through the device, and heating it by Joule heating. When the operating temperature is achieved, the photonic device may emit the desired spectrum of radiation, often in the infrared portion of the electromagnetic spectrum.

Since it is desired to heat the photonic device itself, and not the leads delivering the current to the photonic device, ideally, the leads are made from a low resistance material. Furthermore, it is desired that the resistivity of the lead material be stable with time and with heating cycles, such that the operating point and output of the photonic device do not change over time or with repeated use.

SUMMARY

In one exemplary embodiment of a photonic device, a photonic crystal is made from annealed platinum, to which electrical leads of nickel are attached. The platinum layer may be about 1000 Angstroms thick, and may have small holes, smaller than the wavelength of the emitted radiation. The holes may form a rectangular diffraction grating in the platinum layer. In one exemplary embodiment, the diameter of the small holes is about 2 µm, and these holes and their separation determine the radiation pattern emitted from the device. To operate the photonic device, current may be applied through the nickel leads and into the photonic crystal, heating the photonic crystal to its operating temperature of about 350 degrees centigrade. Importantly, the nickel leads add about 10% additional resistance to the circuit, with the bulk of the resistance provided by the photonic crystal itself. Nickel is chosen for the leads because of its low resistivity and ease of manufacturing. The nickel may be plated or sputter-deposited, and then formed into leads using ion-milling or similar patterning techniques. However, it would be desirable if the nickel had less resistance, so that more of the heat was generated in the photonic crystal device, rather than in the leads themselves.

It is known that alloying the nickel with impurities such as manganese may be expected to improve the mechanical characteristics, especially in terms of creep and strength. However, alloying also tends to raise the resistivity of the material because of increased electron scattering by the alloying material in the lattice or grain boundaries of the crystal matrix. Accordingly, alloys such as NiMn are generally not considered to be appropriate choices for the fabrication of the leads of the photonic device, because the increased resistance would lead to unacceptable losses in drive voltage in the leads, and heating of the leads through Joule heating. It is not possible to simply increase the thickness of the leads in order to reduce their resistance, because the additional material will also increase the thermal conductivity of the leads, with the result that it is more difficult to achieve the desired operating temperature and radiation output from the device.

Materials and processes are described here which address the above-mentioned problems, and may be particularly applicable to the formation of MEMS current-driven devices, wherein the current-driven device is designed to operate at a temperature in excess of about 200 degrees centigrade, and more preferably in excess of about 300 degrees centigrade. A novel NiMn alloy is used to fabricate conductors which deliver drive current to the current-driven devices. The materials and processes described herein may use a very small amount of manganese to form a NiMn alloy with less than about 1% manganese. It has been found that in contrast to raising the resistivity of the NiMn alloy as would be expected, this small amount of Mn actually reduces the sheet resistance of the NiMn alloy. It has also been found that this small additional amount of manganese results in an alloy whose low sheet resistance does not change with temperature cycling, and has good mechanical properties. Accordingly, this alloy may be appropriate for use as the conductive lead structure on a current- or thermally-driven device.

The NiMn alloy includes at least about 0.001% by weight and at most about 1% by weight of manganese and at least about 99% by weight of nickel. More preferably, the percentage by weight of manganese in the alloy is about 0.025%. This results in a material with higher recrystallization temperature, improved creep, strength, and elasticity, and with lower sheet resistance than the pure Ni. It is hypothesized that the improved properties result from the migration of the Mn to the grain boundaries of the film, promoting larger grains and therefore lower resistance. It is further hypothesized that the larger grains offset the increased scattering due to the alloying material in the lattice of the nickel, and therefore lead to a lower resistance structure.

The NiMn alloy may be well suited to forming the conductors in current- or thermally-driven microdevices, which operate at temperatures in excess of about 200 degrees centigrade. In particular, the materials and processes may be applicable to MEMS photonic crystals, which require stable, low resistance conductors to provide current to the photonic crystal.

The material may be deposited by plating the alloy from a plating bath having appropriate concentrations of manganese and nickel to create the 0.025% Mn alloy. Alternatively, the NiMn alloy may be sputter deposited using a NiMn target of the appropriate stoichiometry.

These and other features and advantages are described in, or are apparent from, the following detailed description.

BRIEF DESCRIPTION OF THE DRAWINGS

Various exemplary details are described with reference to the following figures, wherein.

DETAILED DESCRIPTION

The systems and methods described herein may be applicable to a wavelength-controlled photonic device, or any of a number of other current- or thermally-driven micromechanical devices. In particular, the systems and methods described here may be suited to current-driven devices designed to operate at temperatures in excess of about 200 degrees centigrade, and more preferably in excess of about 300 degrees centigrade. However, it should be understood that these embodiments are exemplary only, and that the material disclosed herein may be used in any application requiring structures having good stability as well as low resistance. For example, the systems and methods disclosed here may be particularly suited to devices which are sensitive to thermal efficiencies and changes in these efficiencies, such as bolometers and optical emitters and detectors, especially infrared emitters and detectors.

Figure 1:
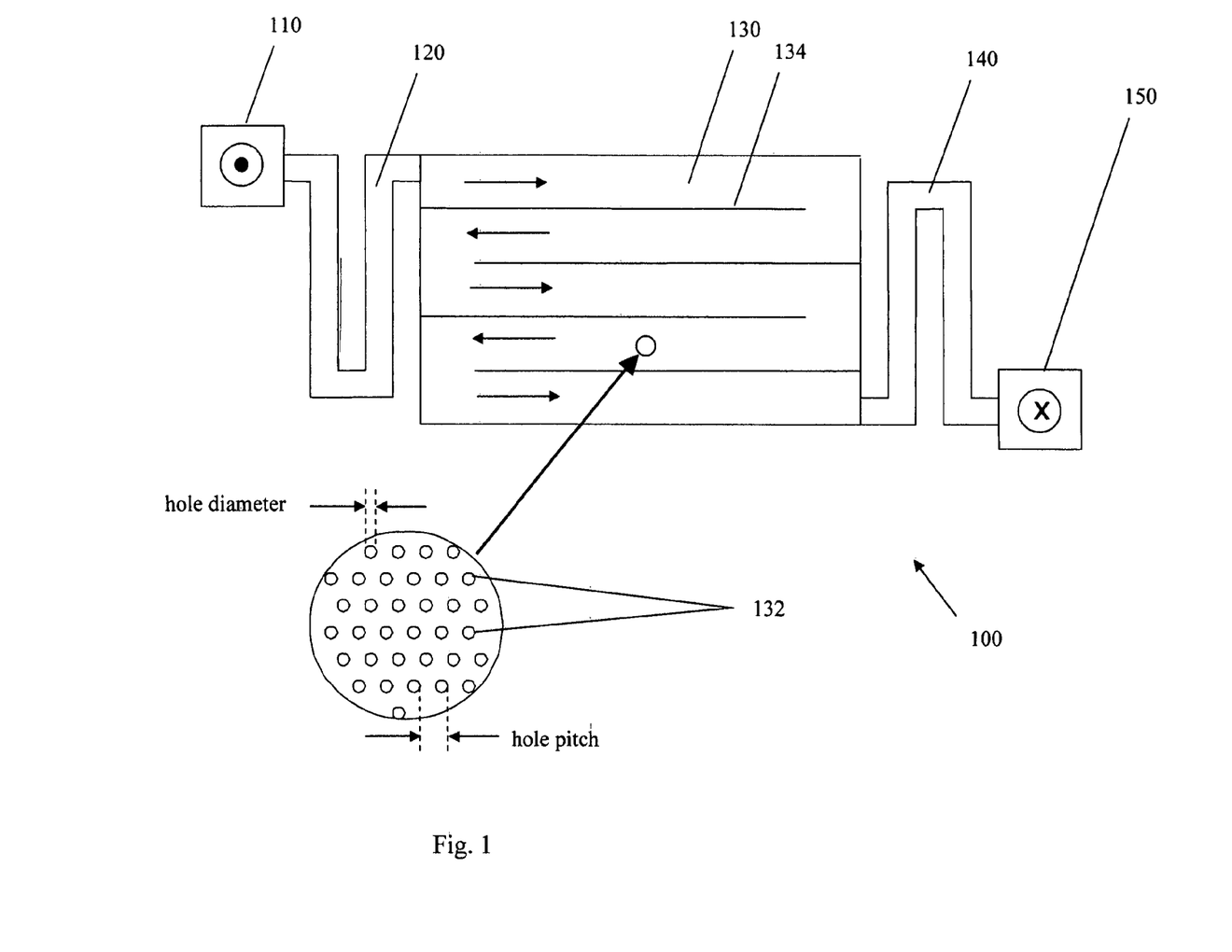
FIG. 1 is a schematic illustration of the MEMS photonic device using a NiMn alloy.

FIG. 1 shows an example of a platinum-based photonic crystal 100 which may be an appropriate application for the material described herein. As used herein, the term "photonic crystal" should be understood to mean a multilayer device which interacts with photons in a particular portion of the electromagnetic spectrum, because of interaction of the photons with a diffractive structure in the photonic crystal. The photonic device 100 may include a photonic crystal 130 and two electrical leads, 120 and 140. Each electrical lead 120 and 140 connects a pad 110 and 150 to the photonic crystal 130, respectively. The electrical leads 120 and 140 serve to supply the photonic crystal 130 with the current needed to heat the device and to produce the infrared photons, when the appropriate voltage is applied to pads 110 and 150.

The photonic crystal may be a tri-layer device, having two metal films separated by a dielectric, with a grating formed on at least the top metal film. The operation of such photonic devices is described in, for example, "Surface-Plasmon-Enhanced Optical Transmission through Planar Metal Films," (L. Lin, et al., Progress in Electromagnetics Research Symposium 2005, Hangzhou, China, August 22-26, pp. 634-637). In such devices, the infrared spectral output is determined largely by the diameter and pitch of a regular pattern of small holes patterned in at least the upper metal layer. The diameter of the holes is generally smaller than the wavelength of the desired radiation, such that the holes may form a rectangular diffraction grating for the radiation. While in this embodiment, the small holes are formed in a hexagonal, close-packed array, it should be understood that this embodiment is exemplary only, and that the small holes may be formed in other regular patterns.

In the exemplary embodiment illustrated in FIG. 1, the regular pattern of holes 132 may be about 2 μm+/−0.1 μm in diameter, and separated by a pitch of about 3.2 μm+/−0.01 μm. This diameter and pitch are appropriate for the formation of a photonic crystal emitting radiation in the 3-5 μm spectral region. However, it should be understood that these dimensions may pertain only to this exemplary embodiment, and other values may be chosen, depending on the application.

The photonic crystal may have at least one void patterned in the annealed platinum, in order to route a current through the photonic crystal in a circuitous fashion. In particular, the photonic crystal 130 may be etched in such a way as to form a serpentine circuit for the current to flow in the directions shown in FIG. 1. This may be accomplished by forming a regular set of parallel, horizontal voids 134 in the platinum film. The presence of the voids 131 increases the path length required for the electrons in the current to transit the photonic crystal 130, thus raising the total resistance and thus the temperature of the crystal by Joule heating. The total area of the photonic crystal 130 may be about 2 mm by 3 mm, and the total path length of the current through the photonic crystal 130 may be about 15 mm. The total resistance of the photonic crystal, including the path length through the current leads and the path length through the crystal, around the voids, may be about 100 ohms.

The leads 120 and 140 may also be formed in a serpentine pattern as shown in FIG. 1. The presence of the serpentine in the lead gives the lead a longer thermal path, in order to reduce the amount of heat leaking from the photonic crystal 130 into the substrate by providing increased thermal resistance of the longer leads. The leads may be formed from a dilute nickel-manganese alloy with atomic percentage between about 0.001% and about 1% Mn. The current required to operate the device may be about 15 mA through a total resistance of 100 ohms, so that a supply voltage of 1.5 V applied across pads 110 and 150 may be sufficient. However, the output wavelength and power may depend on the temperature achieved in the device, so that these voltage and current parameters may be adjusted suit the desired output quantities.

It has been determined by the inventors, that the addition of a small amount of manganese (Mn) to nickel (Ni) to form a NiMn alloy provides a conductive material with lower and more stable sheet resistance than the pure metal, as shown in Table 1, below. This is particularly surprising in view of published resistance measurements (T. Farrell et al., J. Phys. C, 1968, Ser. 2, vol. 1, pp. 1359-1369) of a NiMn alloy having 0.5% Mn. The published results indicate that the 0.5% Mn alloy has about a 10% higher resistivity (Ice-point resistivity=7.02 μOhm-cm) than the pure Ni (Ice-point resistivity=6.31 μOhm-cm). Furthermore, this reference states that for dilute alloys, the residual resistance is proportional to the impurity concentration. In other words, the resistance of a NiMn film with any concentration of manganese is expected to be at least as high as the pure metal, and the amount by which it is higher depends on the concentration of the impurity Mn.

However, in contrast to the expectations set forth in the published literature, the resistance of NiMn at very low concentrations (less than about 1% by atomic percentage) of the impurity metal is actually lower than that of the pure metal. Experimental results summarizing the resistance values for NiMn films where the Mn concentration is on the order of 0.01% is shown in Table 1, below. Unless otherwise stated, all of the measured values of the films presented hereinafter refer to a 0.01% NiMn alloy or a pure Ni sample. The values shown in Table 1 are the resistance of a pure Ni film and that of the NiMn alloy film, before and after a baking step. The baking step approximates the condition of the nickel films before and after operation of the photonic crystal device at 350 degrees centigrade.

TABLE 1

| Sheet Film Compostion | Pre-Bake Resistance (Ohms/Square) | Bake Temperature (Deg C.) | Post-Bake Resistance (Ohms/Square) | Resistance Change (Deg C.) |
|---|---|---|---|---|
| Ni | 21.5 | 200 | 22.2 | 0.7 |
| Ni | 23.8 | 250 | 21.9 | -1.9 |
| Ni | 23.5 | 300 | 20.3 | -3.2 |
| Ni | 22.1 | 350 | 19.4 | -2.7 |
| NiMn | 16.3 | 200 | 16.2 | -0.1 |
| NiMn | 18.8 | 250 | 18.6 | -0.2 |
| NiMn | 18.3 | 300 | 18.9 | 0.6 |
| NiMn | 15.5 | 350 | 16 | 0.5 |

According to Table 1, the sheet resistance of the NiMn alloy is lower than that of pure Ni, in all cases, before and after baking. The temperature may have the effect on the pure nickel film of annealing the smaller grains into larger grains, thus reducing the resistance. In fact, for the pure Ni metal, the sheet resistance after baking drops from about 22 ohms/square to about 19 degrees centigrade after a 350 degree bake. In contrast, the 0.01% NiMn alloy has a sheet resistance of about 17 ohms/square, and remains relatively stable after baking. This data suggests that the NiMn alloy grains start out relatively large, and do not change dramatically with further annealing. Therefore, the sheet resistance of the NiMn alloy films is generally at least about 10% lower than the sheet resistance of the pure Ni film.

Figure 2:
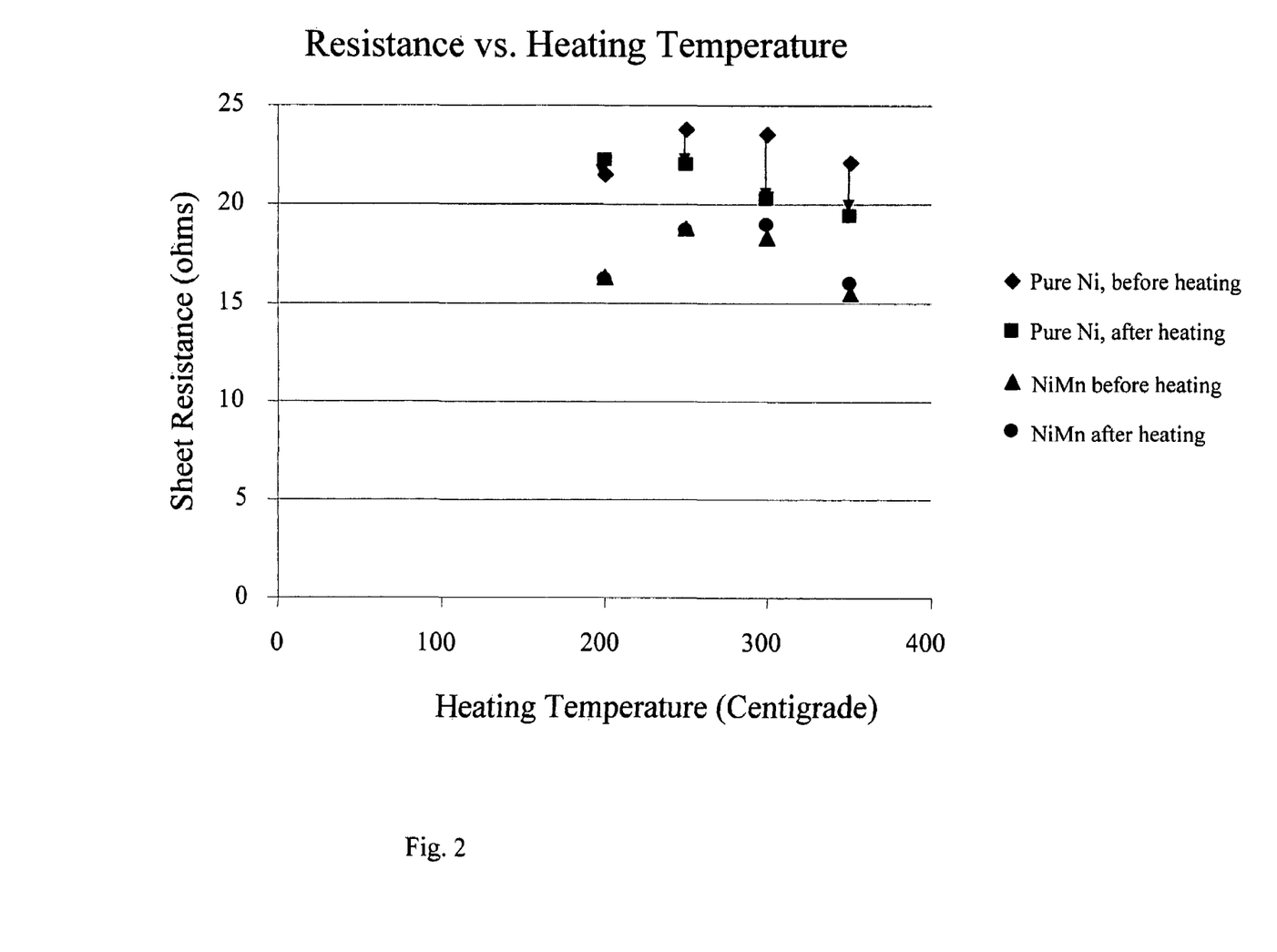
FIG. 2 is a plot of the resistance of a pure nickel film compared to a NiMn film, as a function of heating temperature.
Figure 3:
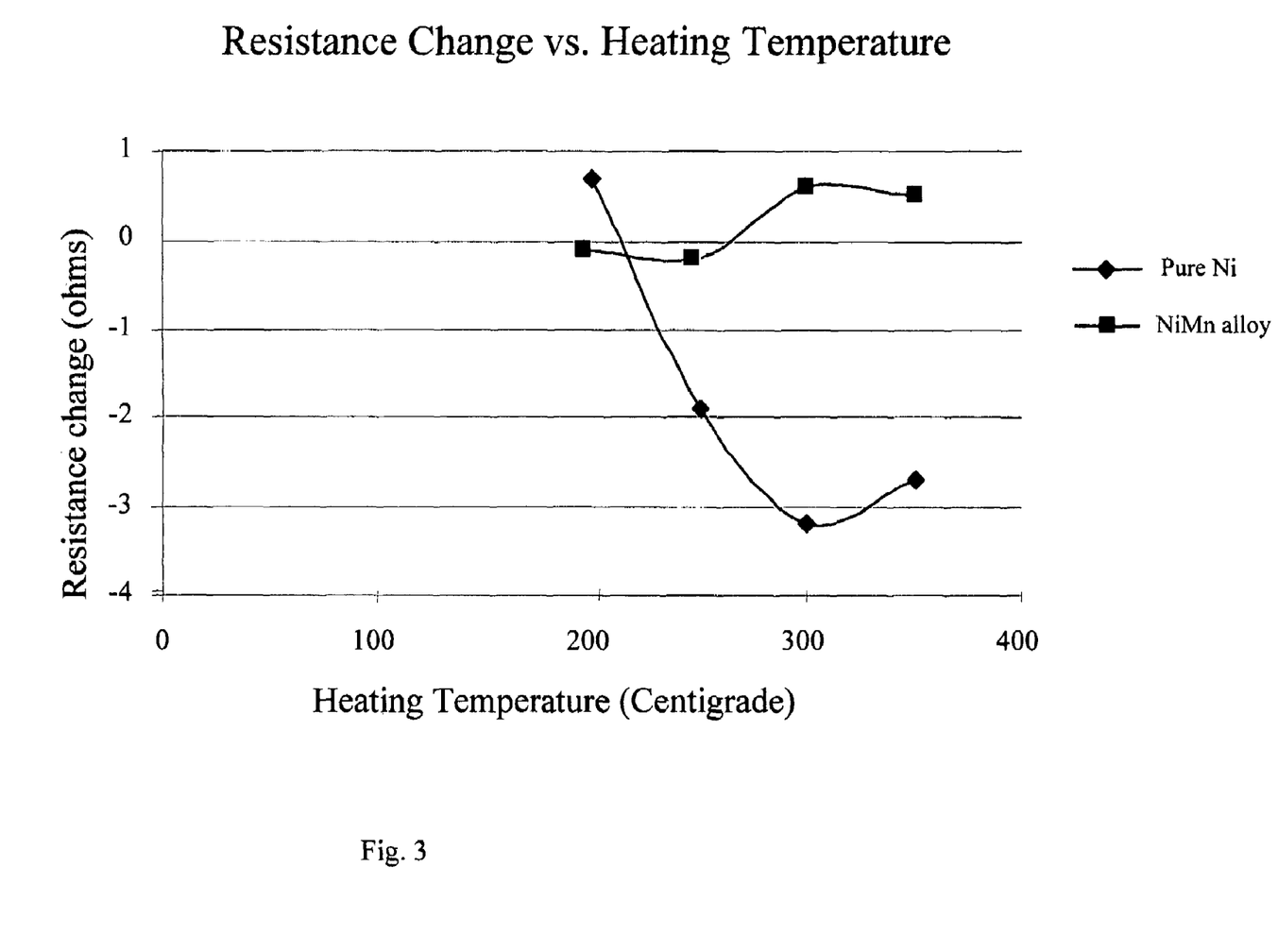
FIG. 3 is a plot of the change in resistance of the pure nickel film compared to the NiMn alloy, as a function of heating temperature.

The data shown in Table 1 is plotted in FIGS. 2 and 3, which show the lower resistivity of the NiMn alloy film compared to the pure Ni film. The data for the change in resistivity before versus after baking are shown in FIG. 3. FIGS. 2 and 3 show that the resistivity of the NiMn film is always lower than that of the pure Ni film, and that it also changes less after the baking step. As a result, the NiMn leads 120 and 140 may be expected to have lower resistance than leads formed of pure Ni, and that the resistance may be expected to remain stable after operating the photonic crystal 130. This property may be especially important for wavelength-specific devices which rely on constant resistance to perform measurements, such as bolometers and infrared detectors. This feature is also important for the reliable functioning of a photonic crystal, because changes in the resistance of the leads may result in changes in the voltage drop across the photonic crystal, so that the operating temperature, and thus the crystal output, may change as the lead resistance changes.

The resistance of the NiMn leads 120 and 140 shown in FIG. 1 is less than about 10 ohms, and more preferably about 8 ohms, +/- about 2 ohms. Accordingly, the leads may add less than about 10% additional resistance to the device, since the device may be specified to have a resistance of about 100 ohms, +/- about 10%. The thickness of the leads may be about 1 μm and the width about 10 μm, such that as designed, about 60-70% of the heat generated in the device is conducted out the leads as the device is functioning.

Figure 4A:
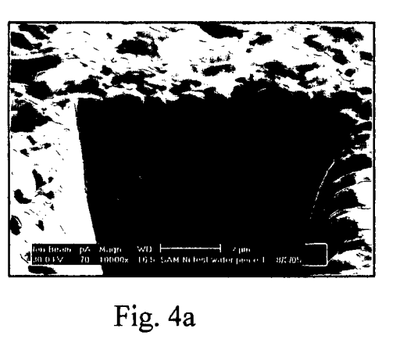
FIG. 4a-4d are SEM photomicrographs of samples of pure nickel and samples of 0.01% NiMn, showing the grain structures of the films.
Figure 4B:
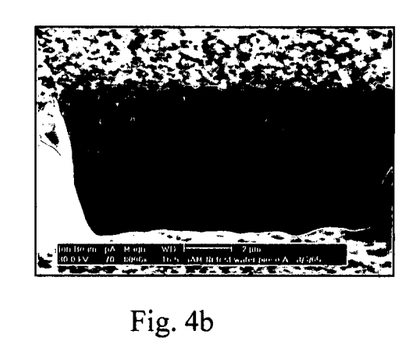
Figure 4C:
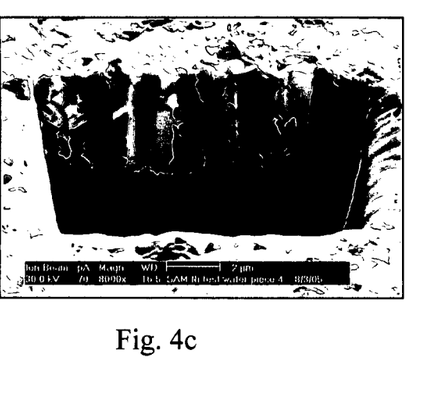
Figure 4D:
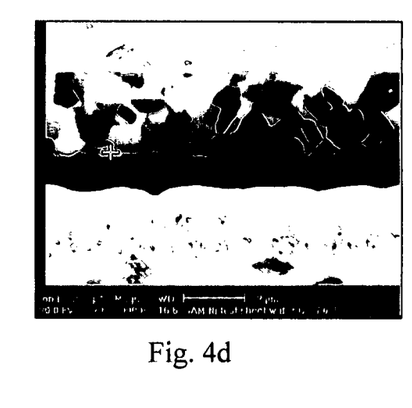

It is hypothesized that the lowering of the sheet resistance of the alloy occurs as a result of the larger grain size of the alloy compared to the pure material. The larger grain size may be promoted by the presence of the manganese in the alloy, which may serve as nucleation sites for the larger grains. The larger grains are readily evident in SEM cross sections taken of the material. Exemplary SEM cross sections of the 0.01% NiMn alloy and pure Ni are shown in FIGS. 4a-4d. FIGS. 4a and 4c are SEM cross sections of the NiMn alloy film taken initially at room temperature and then after annealing at 350 degrees centigrade, respectively. For comparison, FIGS. 4b and 4d show a pure Ni film under the same conditions. The magnification for each image is the same. As is clearly evident in FIGS. 4a and 4b, the grain size in the NiMn film is about ten times larger than that in the pure Ni film. In fact, the grain size of the NiMn film is of the order of about 1.0 μm, whereas the grain size in the pure Ni film is of the order of about 0.1 μm. Although the grain size of the pure nickel film increases with annealing temperature as shown in 4b and 4d, it only approaches the grain size of the NiMn alloy at the highest temperatures. This is consistent with the data shown in Table 1.

The data in FIGS. 4a-4d and in Table 1 also indicate that the recrystallization temperature of the NiMn film is much higher than that of pure Ni, so that the attributes of the structures made with the NiMn alloy do not change with repeated temperature cycling. This may be particularly important in photonic applications, wherein temperatures of several hundred degrees centigrade may be reached during the operation of the device. Accordingly, a MEMS current-driven device using the NiMn alloy may have well defined performance characteristics which do not change appreciably over the operating lifetime of the device.

In addition to the lower resistance, other mechanical properties of the material may be enhanced, or at least not appreciatively degraded as a result of the addition of the alloying manganese to the pure nickel metal. Among the other mechanical properties of interest for the NiMn alloy are its Young's modulus and hardness. The reduced Young's modulus of NiMn is measured to be about 30-60 GPa, as compared to a reduced Young's modulus for pure Ni of about 120 GPa. The hardness of the alloy is measured to be about 2-5 GPa, as compared to a hardness of the pure Ni of about 6-9 GPa. Therefore, because of the very low atomic percentage of manganese added to the alloy, the modulus and hardness values for the alloy are generally within about a factor of two of the values for the pure metal.

Figure 5:
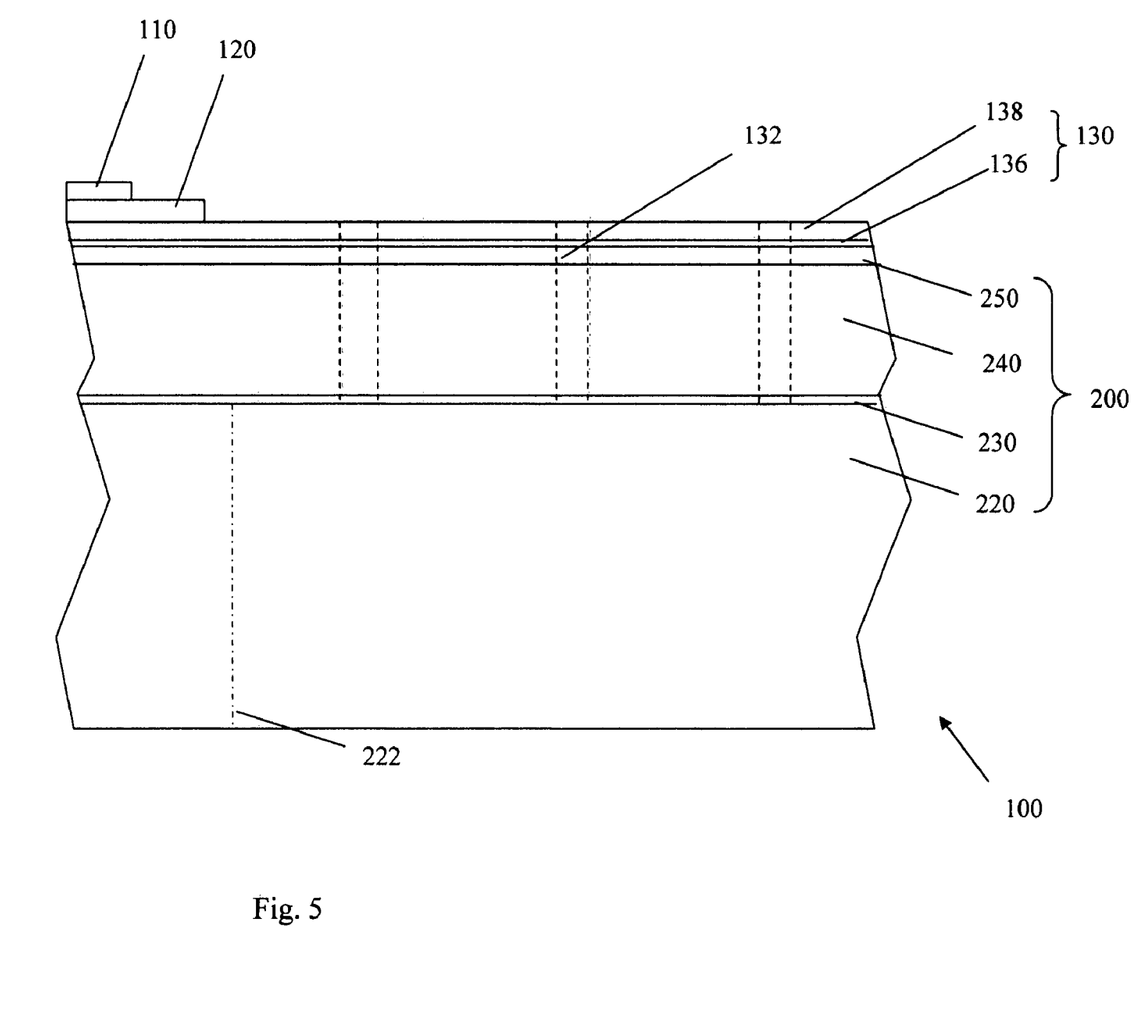
FIG. 5 is a cross sectional diagram of the MEMS photonic device using a NiMn alloy.

FIG. 5 is a cross sectional diagram showing the structure of the MEMS photonic device 100 of FIG. 1. The device may be constructed on a composite silicon-on-insulator (SOI) wafer 200, with a thick, 500 μm handle layer 220, a thin 2 μm thick layer 230 of silicon dioxide dielectric, and a 2 μm thick silicon device layer 240. Prior to building the photonic device on the SOI wafer, a 1000 Angstrom thick layer 250 of silicon dioxide, or other suitable dielectric, may be grown or deposited on the SOI wafer. This dielectric layer may form the dielectric between two metal layers required for the generation of surface plasmons, as is well known in the art. A photonic crystal layer 130 is then formed over the silicon dioxide layer 250. Thus, the silicon device layer 240 may form the lower, first metal layer, the silicon dioxide layer 250 may form the intervening dielectric, and the photonic crystal layer 130 may form the second, upper metal layer of the tri-layer photonic device.

The upper, photonic crystal layer 130 may include a 100 Angstrom thick layer 136 of titanium (Ti) for adhesion to the SOI substrate and a 1200 Angstrom thick layer 138 of platinum (Pt). This Ti—Pt multilayer may be annealed at about 1200 degrees centigrade before further processing to form the photonic crystal 130. The metal layers 136 and 138 may be formed using any convenient deposition technique, such as sputter deposition. After annealing, the Ti—Pt multilayer may be processed to form the voids 134 which define the serpentine current flow through the photonic crystal 130. The voids 134 may be formed by coating the substrate with photoresist (not shown), patterning the photoresist with the serpentine pattern, ion milling the Ti—Pt multilayer to form the voids 134, and stripping the resist. The basic outline of the photonic crystal 130 may also be defined at this point.

The metal material which will form the leads 120 and 140 may then be deposited over the substrate 200 and the photonic crystal layer 130. In one exemplary embodiment, the material for the leads 120 and 140 is a NiMn alloy, including between about 0.001% and about 1% Mn by atomic percentage. More preferably, the NiMn alloy may contain about 0.025% by atomic percentage of manganese. This material may be plated or sputter deposited over the surface of the substrate.

If sputtered, the film may be deposited by sputter deposition from a NiMn target of appropriate stoichiometry. In particular, the NiMn alloy film may be sputter-deposited from an alloy target containing about 0.025% Mn, to form an alloy film of this atomic percentage. The film may be sputter deposited using, for example, a CVC cluster deposition tool manufactured by Veeco Instruments, Inc. of Plainview, N.Y. The sputter-deposited film may then be patterned by ion milling, using standard photolithographic procedures.

If plated, the plating may be preceded by the deposition of photoresist which is then exposed and removed in areas where the leads 120 and 140 are desired. The NiMn alloy may then be plated into the open areas of the photoresist, using the underlying platinum as a conductive seed layer for the plating process. In this manner, the photoresist serves as a stencil for the plating operation. A NiMn plating process used to produce low resistivity NiMn leads 120 and 140 is described below.

The method may be practiced using standard thin film electroplating equipment. The NiMn plating bath contains nickel sulfamate, manganese sulfamate, boric acid and a wetting agent in an aqueous solution. The wetting agent may be any standard commercially available nickel sulfamate wetting agent. The plating bath may be prepared having the composition set forth in Table 2:

TABLE 2

| Constituent | Units | Min | Max | Nominal |
|---|---|---|---|---|
| Ni | g/L | 75 | 105 | 89 |
| Mn | g/L | 1.2 | 1.4 | 1.3 |
| Ni:Mn ratio | | 65 | 77 | 73 |
| Boric Acid | g/L | 19.5 | 25.5 | 22.5 |

TABLE 2-continued

| Constituent | Units | Min | Max | Nominal |
|---|---|---|---|---|
| Wetting Agent | mL/L | 0.15 | 0.25 | 0.20 |
| pH | | 2.2 | 2.8 | 2.5 |

The acidity of the plating bath may be important because it, along with temperature, current and concentration of the plating bath, it may affect the deposition rate of the NiMn alloy from the plating process. The pH of the plating bath may be adjusted by adding a small amount of sulfamic acid solution to the bath, as described below.

The following steps may be taken to prepare the plating bath of the composition set forth above:

1. Make up a boric acid solution by mixing boric acid with water in a concentration somewhat greater than the eventual target concentration (25.5 g/l) as it will be diluted by subsequent components. For example, a concentration of boric acid of 36 g/l may be prepared for later use.
2. Add nickel sulfamate to the mixing tank such that the nickel concentration is on target.
3. Circulate the solution through a filter to eliminate particles and debris.
4. Add the pre-mixed boric acid such that the boric acid concentration is on target.
5. Add manganese sulfamate such that the Mn concentration is on target.
6. Carefully add sulfamic acid solution with stirring or recirculation to adjust pH to the target value.

Plating Parameters:

TABLE 3

| Parameter | Units | Min | Max | Nominal |
|---|---|---|---|---|
| Temperature | C. | 40 | 60 | 51 |
| Current Density | mA/cm2 | 2 | 20 | 8 |
| Flow Rate | gal/min | 2 | 5 | 2.5 |

According to the plating parameters set forth in Table 3, the plating bath is first heated to a temperature of about 51 degrees centigrade and the substrate is submerged in the plating bath. The flow rate of the solution through the plating bath is set to be about 2.5 gal/min. Upon submerging the substrate 200 in the plating bath, a current density of about 8 mA/cm$^2$ is applied between the electrodes of the plating apparatus until the desired thickness is achieved. The nominal plating rate under these conditions may be about 6 microns per hour. Alternatively, an alternating current waveform may be used to plate the NiMn from the plating bath. The plating may result in the deposition of a layer about 1 μm thick of the NiMn alloy as leads 120 and 140, over the previously formed platinum photonic crystal layer 130. The alloy composition of the resulting lead structure 120 or 140 may be less than about 0.01% manganese and at least about 99.99% nickel. The atomic % of the manganese in the NiMn alloy may be adjusted for different applications, by, for example, adjusting the Ni:Mn ratio of the plating bath from the specification of 73, as set forth above, to a lower number for a larger proportion of Mn, for example. This process was used to form the NiMn alloy material for the data shown in FIGS. 4a-4d.

The plating process may form the leads with the appropriate geometry, with a lead width of about 10 μm and a lead thickness of about 1 μm.

The plating process may produce the serpentine lead shape directly by plating into the patterned photoresist. If sputter deposition is used instead of plating, the deposition of the metal alloy may be followed by ion milling to define the serpentine lead pattern. In this embodiment, photoresist may be exposed and developed in all areas not corresponding to the locations of the leads. The sputter-deposited lead material may then be removed by ion milling through the photoresist mask. This method may also form the serpentine leads 120 and 140 with the desired width of about 10 μm and lead thickness of about 1 μm.

The gold pads 110 and 150 may then be formed over the NiMn leads by, for example, plating or sputter deposition, in a manner similar to that described for the NiMn leads 120 and 140, using either sputter-deposition or plating. The gold pads may be square, for example, and about 150 μm on a side and between 0.5 to about 5 μm thick. The gold pads may provide a structure to which electrical leads may be wire bonded to operate the photonic device 100.

After formation of the gold pads, the small holes 132 of the photonic device 100 may be patterned in the photonic crystal layer 130. The small holes may be formed by first coating the substrate with photoresist, patterning the photoresist with the array of 2 μm small holes separated by 22 μm. The small holes may then be formed in the photonic crystal layer 130 by ion milling through the patterned photoresist, and through the silicon dioxide layer 250 by reactive ion etching. If desired, the small holes 132 may be made to extend through the lower silicon layer 240 by deep reactive ion etching (DRIE) through the patterned resist.

After formation of the small holes 132 and gold pads 110 and 150, the formation of the photonic device 100 is essentially complete, and the photonic device 100 may be packaged. In general, in order to keep the photonic crystal 130 thermally isolated from surrounding heat sinks that would otherwise prevent the photonic crystal 130 from achieving the required operating temperature, most of the surrounding substrate may be removed before packaging the photonic crystal device 100. To accomplish this purpose, the silicon handle wafer 220 may be etched away within a certain perimeter under the photonic crystal 130, by deep reactive ion etching (DRIE), for example. The etch line and remaining area of the silicon handle wafer 220 are designated with reference number 222 in FIG. 5. The deep reactive ion etching leaves the photonic crystal 130 free standing between two adjacent bonding areas 222 and 224 which consist of the remainder of the silicon handle wafer 220.

Figure 6:
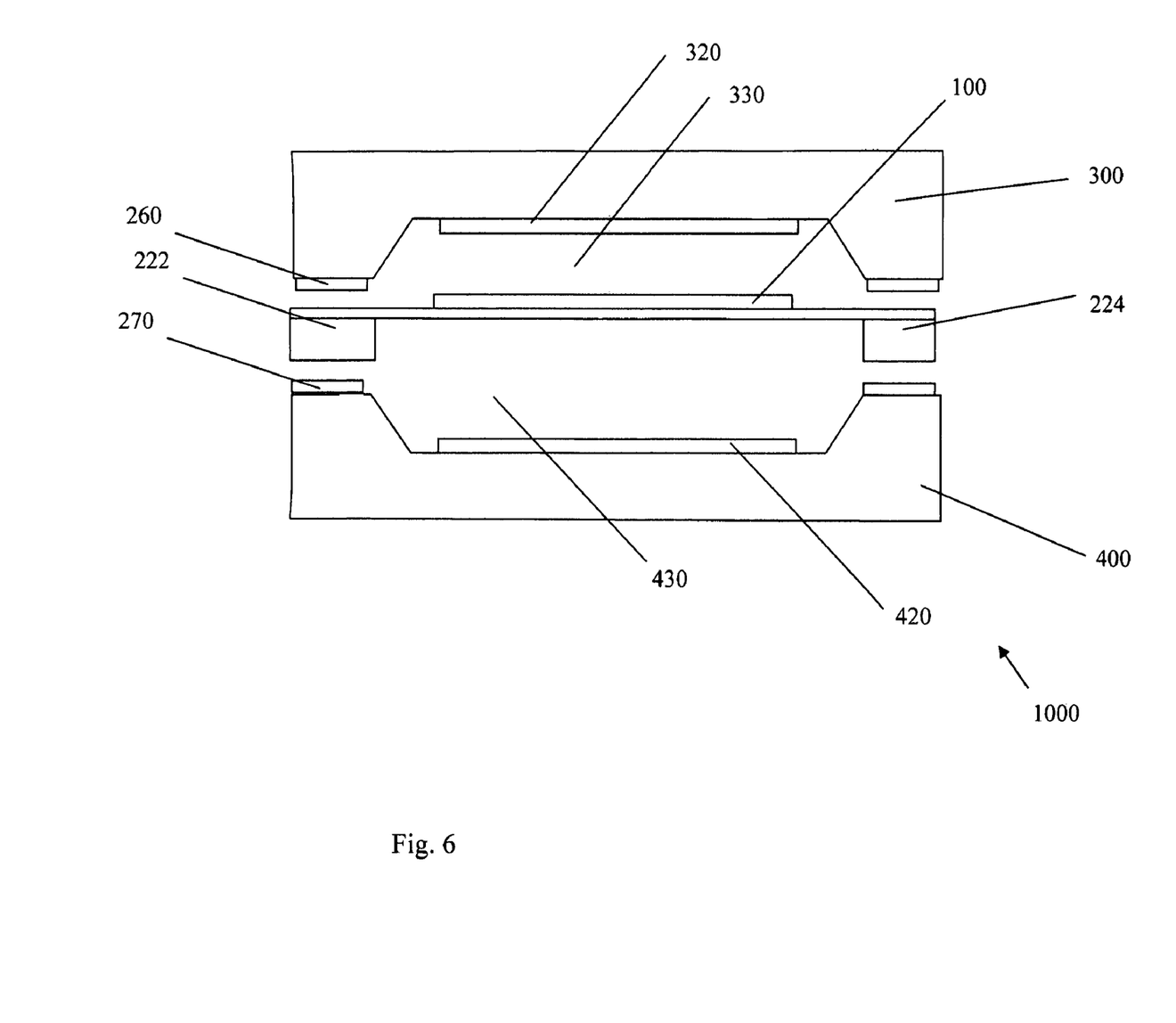
FIG. 6 is a cross sectional diagram of a MEMS photonic device wafer bonded to a lid wafer and a getter wafer.

The wafer with the photonic crystal device 100 may be bonded to a lid wafer 300 to form a vacuum cavity around the photonic crystal device 100. A cross section of an exemplary packaging structure is shown in FIG. 6. The lid wafer 300 may be, for example, glass, metal, silicon or pyrex. The lid wafer 300 may first be processed or etched to form a cavity around the photonic crystal. In one exemplary embodiment, the lid wafer 300 may be a silicon substrate which is first covered with a silicon nitride ($Si_2N_3$) layer (not shown). The silicon nitride layer may then be patterned by reactive ion etching (RIE), for example, to form a hard mask for a later deep etch.

The deep etch may then be performed into the silicon substrate 300 where the silicon nitride has been removed from the lid wafer 300, to provide clearance for the photonic crystal 130. The deep etch may be performed by, for example, exposure to a potassium hydroxide etching solution. The etch depth may be, for example, several hundred μm deep, and the cavity etch may require several minutes to complete. Further details of the process for fabricating and bonding a lid wafer may be found in U.S. patent application Ser. No. 11/211,625, incorporated by reference herein in its entirety. The silicon nitride hard mask may then be removed with an appropriate solvent.

The lid wafer may be coated with antireflective thin film coatings or an antireflective sub-wavelength structure 320. The antireflective structure 320 may be applied to the inner cavity surface of the lid wafer 300. Some examples of appropriate antireflective structures are more fully described in, for example, U.S. Pat. No. 6,897,469, incorporated by reference herein in its entirety.

The photonic device 100 may be further encapsulated with a second getter wafer 400, containing a getter material 420 within a cavity 430 formed in its surface. The getter material may help to maintain a low pressure vacuum by gettering substances emitted or outgassed from the inner cavity surfaces and layers in the micromechanical device. The getter cavity 430 may be formed with a similar process used to form the device cavity 330 in the lid wafer. Getter material 420 may then be deposited in the getter cavity. The getter material may contain zirconium, titanium, vanadium, iron, niobium or tantalum, or alloys thereof combined with other transition elements, rare earth elements or aluminum. Such materials and their deposition are described in, for example, U.S. Pat. No. 4,312,669 and U.S. Pat. No. 5,961,750, and in U.S. patent application Ser. No, 11/433,435, incorporated by reference in their entireties.

An adhesive 260 and 270 may be applied to the bonding surfaces of the remaining portions of the handle wafer 222 and 224, or on the corresponding areas of the lid wafer 300 and getter wafer 400. A glass frit adhesive may be used, such as that described in U.S. patent application Ser. No. 11/390,085, incorporated by reference in its entirety, which when heated to the melting temperature of the glass frit may form a hermetic bond between the wafers. Alternatively, any other suitable adhesive may be used, which is capable of withstanding the 350 degree centigrade operating temperature of the photonic crystal device 100, while maintaining a vacuum seal. Although not shown in FIG. 6, it should be understood that the gold pads 110 and 150 shown in FIG. 1 may be located outside the lid, and leads 120 and 140 may run under the glass frit seal 260 or 270.

The photonic crystal device 100 may then be aligned and assembled with the lid wafer 300 and the getter wafer 400, and placed in a wafer bonder. The chamber of the wafer bonder may then be evacuated, which also evacuates the cavities above 330 and below 430 the photonic device 100. The wafer assembly may then be heated to the melting temperature of the glass frit, at which point the hermetic seal is made, thus encapsulating the photonic device 100 in a vacuum cavity. The vacuum cavity may avoid the radiation and heat losses that would otherwise occur if the device were operated in air. After sealing the individual devices 1000, the wafer assembly may be singulated to separate the individual devices 1000.

Figure 7:
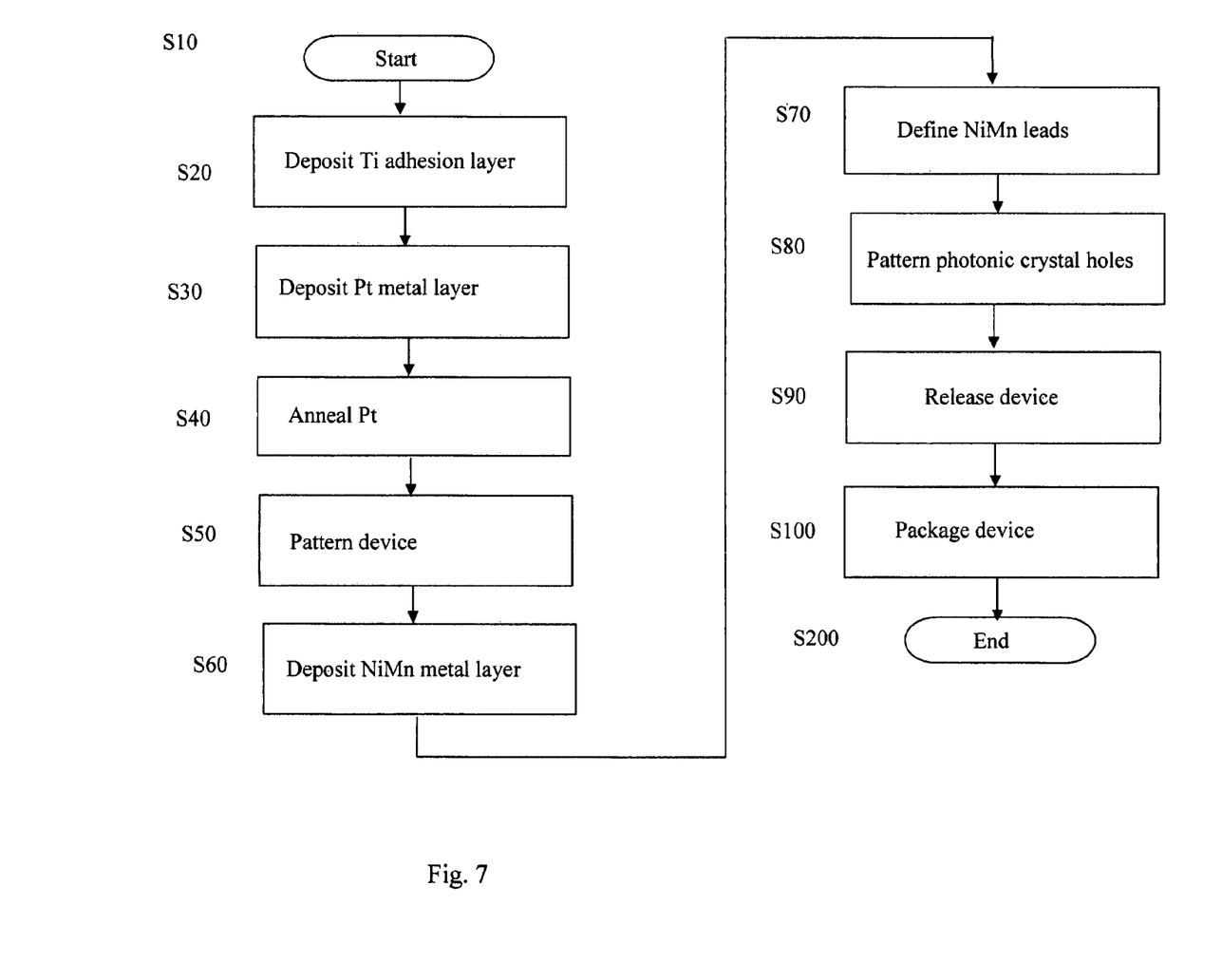
FIG. 7 is a flowchart illustrating an exemplary method for forming the MEMS photonic device with NiMn alloy leads.

An exemplary method for fabricating the MEMS photonic device with the NiMn alloy is shown in FIG. 7. It should also be understood that this method is exemplary only, and that various steps may be omitted or substituted with additional or similar steps, without deviating from the spirit of this invention.

The method begins in step S10 and proceeds to step S20, wherein a titanium adhesion layer is deposited on the substrate surface. In one exemplary embodiment, the substrate is an SOI substrate covered with a 1000 Angstrom thick layer of silicon dioxide, and the Ti adhesion layer is about 100 Angstroms thick, deposited over the silicon dioxide layer. Then, in step S30, platinum (Pt) is deposited over the substrate surface.

In various exemplary embodiments, the Pt layer may be about 1200 Angstroms thick. In step S40, the Pt layer is annealed. In various exemplary embodiments, the Pt layer is annealed at about 1200 degrees centigrade. In step S50, the photonic device is patterned, which is to say that the voids defining the serpentine path of the drive current are formed, and the basic outline of the structure may be created.

In step S60, the NiMn metal layer is deposited. In various exemplary embodiments, the NiMn layer may be deposited using plating or sputter deposition, for example. In step S70, the NiMn layer is patterned to form leads. If the NiMn layer was deposited by plating, the lead shape may be formed as the metal layer is deposited, so that a separate step for defining the lead shape may not be required. In step S80, the photonic crystal holes are formed. In various exemplary embodiments, these photonic crystal holes may be about 2 μm in diameter and about 3 μm in separation, and arranged in a close-packed hexagonal array. However, it should be understood that these values may be altered depending on the spectral region in which the photonic crystal is designed to operate.

In step S90, the device is released from the underlying substrate. This step may be required if the operating temperature cannot otherwise be reached because of thermal coupling to the substrate. The device is packaged in step S100, which may include bonding to a lid wafer and a getter wafer, as previously described. The devices are singulated in step S200.

Figure 8:
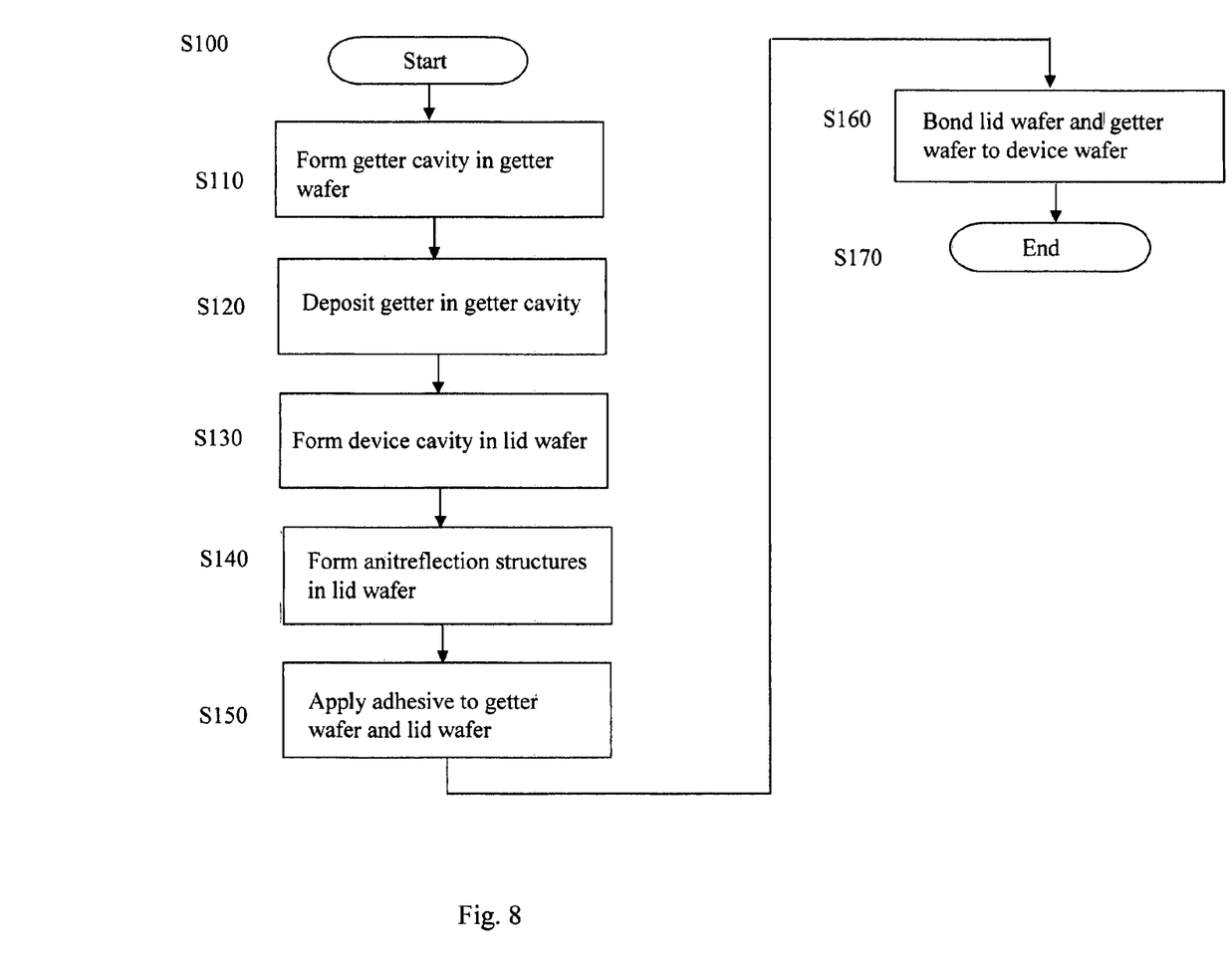
FIG. 8 is a flowchart illustrating additional detail on the packaging step shown in FIG. 7.

FIG. 8 shows further detail of step S100 of FIG. 7, which is the packaging of the micromechanical photonic device. The process begins in step S100 and proceeds to step S110, wherein a getter cavity is formed in a getter wafer. In step S120, a getter material is deposited in the getter cavity. In step S130, a device cavity is formed in a lid wafer. In step S140, an antireflective structure is formed in the cavity of the lid wafer. In step S150, an adhesive is applied to the getter wafer and the lid wafer. In step S160, the getter wafer and the lid wafer are bonded to the device wafer. The process ends in step S170.

It should be understood that not all of the steps shown in FIGS. 7 and 8 may be required, and the steps need not be performed in the order shown. For example, the device cavity may be formed in the lid wafer before the getter cavity is formed in the getter wafer. The getter wafer and the lid wafer may by bonded to the device wafer individually, rather than together as an assembly as indicated in FIG. 8. The wafers need not be singulated as shown in FIG. 7.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. While the embodiment described above relates to a photonic emitter, it should be understood that the techniques and materials described above may be applied to any of a number of other photonic or thermal devices, such as bolometers and detectors. Furthermore, details related to the specific design features and dimensions of the MEMS photonic device are intended to be illustrative only, and the invention is not limited to such embodiments. Accordingly, the exemplary implementations set forth above, are intended to be illustrative, not limiting.

What is claimed is:

1. A microdevice comprising:
   a current-driven portion comprising a photonic crystal; and
   at least one conductive structure consisting essentially of a homogeneous NiMn alloy, wherein the NiMn alloy includes at least about 0.001% atomic percent and at most about 1% atomic percent of manganese and at least about 99% atomic percent of nickel, wherein the conductive structure is electrically coupled to and provides a current to the current-driven portion.

2. The microdevice of claim 1, wherein the conductive structure is disposed over a free standing supporting material no more than about 5 um thick.

3. The microdevice of claim 1, wherein the free standing supporting material is a free standing silicon dioxide layer coupled at its periphery to a silicon handle layer of a silicon-on-insulator wafer.

4. The microdevice of claim 2, wherein the photonic crystal comprises annealed platinum.

5. The microdevice of claim 4, wherein the photonic crystal comprises an array of holes of about 2 μm in diameter, and spaced about 3 μm apart.

6. The microdevice of claim 2, wherein the photonic crystal emits radiation with a wavelength from about 3 μm to about 5 μm.

7. The microdevice of claim 1, wherein the NiMn alloy has a sheet resistance lower than about 20 ohms per square.

8. The microdevice of claim 1, wherein the total resistance of the microdevice is about 100 ohms, and the at least one conductive structure contributes less than about 10 ohms to the total resistance of the microdevice.

9. The microdevice of claim 1, wherein the at least one conductive structure is about 1 μm thick, and the atomic percentage of Mn in the NiMn alloy is about 0.025%.

10. The microdevice of claim 1, wherein the current-driven portion comprises a set of parallel voids formed in the current-driven portion.

11. A method for forming a microdevice with a NiMn conductive structure on a substrate, comprising:
   forming a photonic crystal on the substrate;
   forming at least one conductive structure consisting essentially of a homogeneous NiMn alloy having at least about 0.001% atomic percent and at most about 1% atomic percent of manganese, and at least 99% atomic percent of nickel over the seed layer, wherein the conductive structure is electrically coupled to and provides current to the current-driven portion.

12. The method of claim 11, wherein forming the at least one conductive structure comprises forming the at least one conductive structure on a free standing supporting layer no more than about 5 μm thick.

13. The method of claim 11, further comprising removing a silicon handle layer from the free standing supporting layer beneath the conductive structure so that the supporting layer is free standing between peripheral points, which are coupled to the silicon handle layer of a silicon-on-insulator substrate.

14. The method of claim 13, wherein forming the NiMn alloy by electroplating further comprises:
   providing a plating bath having a solution containing nickel and manganese in a ratio of between about 65 and about 77;
   providing electrodes in the plating bath;
   coupling the substrate to at least one of the electrodes;
   applying a current between the electrodes;
   electroplating the nickel and manganese from the solution to form the NiMn alloy of the conductive structure.

15. The method of claim 11, wherein forming the current-driven portion comprises:
   forming a layer or titanium;
   forming a layer of platinum;
   annealing the platinum; and
   forming an array of small holes in the platinum and titanium layers.

16. The method of claim 15, wherein forming the array of small holes comprises forming the array of small holes of about 2 μm diameter and separated by about 3 μm by at least one of ion milling, reactive ion etching and deep reactive ion etching.

17. The method of claim 15, wherein forming the current-driven device further comprises:
    forming a set of parallel voids through the platinum and titanium.

18. The method of claim 11, further comprising:
    forming a device cavity in a lid wafer;
    forming an antireflective structure in the device cavity; and
    bonding the lid wafer to the substrate.

19. The method of claim 11, further comprising:
    forming a getter cavity in a getter wafer;
    depositing a getter material in the getter cavity; and
    bonding the getter wafer to the substrate.

20. An apparatus for forming a microdevice with a NiMn conductive structure on a substrate, comprising:
    means for forming a current-driven portion comprising a photonic crystal on the substrate; and
    means for forming a conductive structure consisting essentially of a homogenous NiMn alloy having at least about 0.001% atomic percent and at most about 1% atomic percent of manganese, and at least about 99% atomic percent of nickel over the seed layer.

* * * * *